United States Patent [19]
Choi

[11] Patent Number: 5,953,576
[45] Date of Patent: Sep. 14, 1999

[54] METHOD FOR FABRICATING A CAPACITOR OF A SEMICONDUCTOR DEVICE

[75] Inventor: Kyeong Keun Choi, Kyoungki-do, Rep. of Korea

[73] Assignee: Hyundai Electronics Industries Co., Ltd., Kyoungki-do, Rep. of Korea

[21] Appl. No.: 08/925,060

[22] Filed: Sep. 9, 1997

Related U.S. Application Data

[62] Division of application No. 08/670,592, Jun. 26, 1996, Pat. No. 5,702,970.

[30] Foreign Application Priority Data

| Jun. 26, 1995 | [KR] | Rep. of Korea | 95-17479 |
| Jun. 30, 1995 | [KR] | Rep. of Korea | 95-18911 |
| Jun. 30, 1995 | [KR] | Rep. of Korea | 95-18912 |

[51] Int. Cl.⁶ ............................................. H01L 21/8242
[52] U.S. Cl. ................................................. 438/3; 438/240
[58] Field of Search .......................... 438/3, 240, 238, 438/239, 253, 254, 396, 397

[56] References Cited

U.S. PATENT DOCUMENTS

| 5,187,638 | 2/1993 | Sandhu et al. ..................... 361/313 |
| 5,358,889 | 10/1994 | Emesh et al. ............................ 438/3 |
| 5,407,855 | 4/1995 | Maniar et al. ............................ 438/3 |
| 5,466,629 | 11/1995 | Mihara et al. ............................ 438/3 |
| 5,489,548 | 2/1996 | Nishioka et al. ....................... 438/396 |
| 5,668,041 | 9/1997 | Okudaira et al. ...................... 438/240 |
| 5,858,851 | 1/1999 | Yamagata et al. ..................... 438/396 |

*Primary Examiner*—Joni Chang
*Attorney, Agent, or Firm*—Thelen Reid & Preist LLP

[57] ABSTRACT

A method for fabricating a capacitor of a semiconductor device which stabilizes the operation of electrodes of the capacitor and improves the operational characteristic and reliability of the semiconductor device. The method comprises the steps of: preparing a semiconductor substrate; forming an insulating layer on the substrate; forming a contact hole by selectively eliminating the lower insulating layer; forming a plug in the contact hole; forming a Ti/TiN film thereon; forming a first ruthenium oxide film on the Ti/TiN film; forming a first SOG film on the first ruthenium oxide film; implanting impurities into a surface of the first SOG film; forming a second SOG film on the first SOG film, and then selectively eliminating the first and the second SOG films; etching the first ruthenium oxide film and the Ti/TiN film by utilizing the first and second SOG films as a mask; eliminating the first and second SOG films, and then forming a dielectric film on the exposed surface thereof; and forming a second ruthenium oxide film on the dielectric film.

6 Claims, 7 Drawing Sheets

METHOD FOR FABRICATING A CAPACITOR OF A SEMICONDUCTOR DEVICE

This is a divisional of U.S. application Ser. No. 08/670,592, filed Jun. 26, 1996, U.S. Pat. No. 5,702,970.

BACKGROUND OF THE INVENTION

1. Field of the Invention

The present invention relates to method for fabricating a semiconductor device and more particularly, with a method for fabricating a capacitor of a semiconductor device which is especially suitable for a highly-integrated semiconductor device.

2. Description of the Prior Art

Generally, in fabricating a semiconductor device, the devices are implemented in higher integration and so the cells become smaller. Consequently securing sufficient capacitance in proportion to the surface area of the storage electrode has become a big smaller.

Particularly, in a DRAM in which a unit cell is comprised of a single MOS transistor and a capacitor, it is important for the high integration of the DRAM to reduce the area of the capacitor which takes a large part of the area in the chip at the same time with enlarging the capacitance of the capacitor.

In the meantime, the capacitance C is calculated by an equation, $$C = (E0 \cdot Er \cdot A)/T,$$

in which E0, Er, A, and T mean respectively, a vacuum dielectric constant, a dielectric constant of a dielectric film, an area of the capacitor, and a thickness of the dielectric film, that is, the larger the specific dielectric constant Er of the dielectric film and the lesser the thickness T of the dielectric film, the larger the capacitance of C. Therefore, to achieve the high integration of the semiconductor device, it is preferred that the dielectric film is thin and made from a material having a high dielectric constant.

However, in the case in which the dielectric film is thin and made from a material having a high dielectric constant, the electric characteristic of the device becomes unstable and the reproduction characteristic thereof deteriorates due to the hillock and pin hole phenomena which occurs on a surface of the lower electrode to form a capacitor.

Therefore, a process has recently been proposed to absolve the above problem. In this process, an upper electrode and a lower electrode are formed by means of ruthenium oxide ($RuO_2$), and then their operational characteristic is stabilized by heat treatment.

The conventional process will be described hereinafter with reference to FIGS. 1A to 1C which are schematic cross sectional views of a semiconductor device for showing the steps of the conventional process.

Figure 1A:
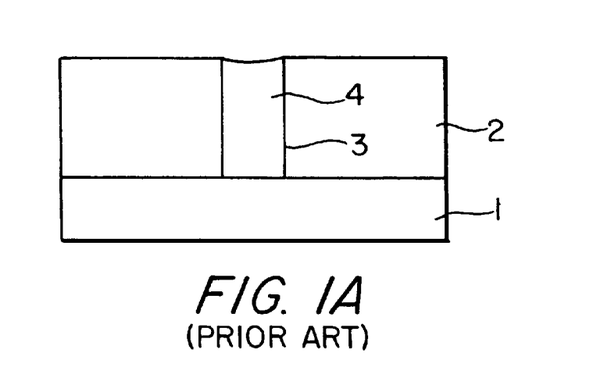
FIGS. 1A to 1C are schematic cross sectional views of a semiconductor device which show the steps of a conventional method for fabricating a capacitor of a semiconductor device.

First, a lower insulating layer 2 is formed on a semiconductor substrate 1 as shown in FIG. 1A. Thereafter, the lower insulating layer 2 is selectively etched by means of a contact mask (not shown) for a capacitor so that a contact hole 3 for exposing that predetermined portions of the semiconductor substrate 1 is formed.

Thereafter, a polycrystalline silicon film (not shown) is formed on the entire exposed surface, and then the polycrystalline silicon film is etched so as to form a plug 4 in the contact hole 3.

Figure 1B:
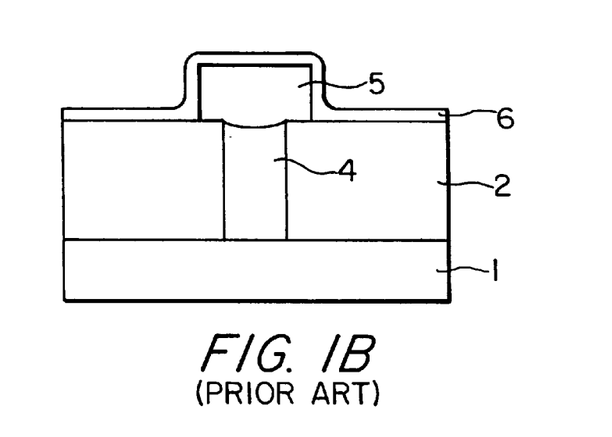

Then, as shown in FIG. 1B, a first ruthenium oxide ($RuO_2$) film 5, to be used as a lower electrode of the capacitor, is formed on the entire plug 4 and a part of the lower insulating layer 2, in the vicinity of the plug 4. Thereafter, dielectric material is deposited on the first ruthenium oxide film 5 so as to form a dielectric film 6.

Figure 1C:
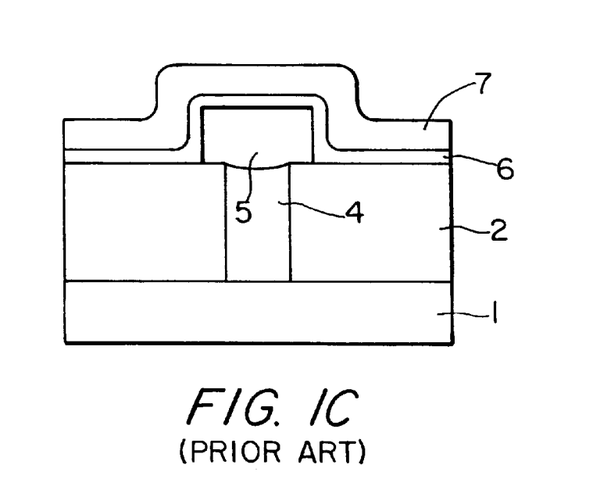

Thereafter, as shown in FIG. 1C, a second ruthenium oxide ($RuO_2$) film 7, to be used as an upper electrode of the capacitor, is formed on the dielectric film 6 so that the manufacture of the capacitor is completed.

In this case, the first and the second ruthenium oxide films 5 and 7 are formed by means of ruthenium target and oxygen gas or according to a process in which ruthenium is deposited by the chemical vapor deposition (CVD) method and is then oxidized in a tube through annealing treatment.

The following is a discussion of the problems of the conventional method for fabricating a capacitor of a semiconductor device, as described above.

In the conventional method for fabricating a capacitor of a semiconductor device, in case where the ruthenium oxide films are formed by means of ruthenium target and oxygen gas, stable ruthenium oxide films are difficult to form due to the low oxidation speed of the ruthenium.

Furthermore, when partial pressure of the oxygen gas is high, $RuO_3$ gas or $RuO_4$ gas, which has a strong volatility, is generated, and thus, the thin film is volatilized.

Moreover, in a case where ruthenium is deposited by the CVD method and is then oxidized in a tube through the annealing treatment when the ruthenium oxide film (RuOx) is formed in the conventional method for fabricating a capacitor of a semiconductor device, $RuO_3$ gas or $RuO_4$ gas, which has a higher volatility than that of the ruthenium oxide film, is generated when the ruthenium is oxidized in the tube, and thereby the tin film is volatilized.

Therefore, in the conventional method for fabricating a capacitor of a semiconductor device, due to the phenomenon that the thin film is volatilized, a desirable capacitor is not formed. Furthermore, the reliability and the operational characteristic of the semiconductor device deteriorates.

In other words, because the thin film is volatilized and degraded due to oxide generated during the formation of the pattern, the reliability and the operational characteristic of the semiconductor device deteriorates.

Therefore, the conventional method for fabricating a capacitor of a semiconductor device is not suitable for the high integration of the semiconductor device.

SUMMARY OF THE INVENTION

The present invention has been made to overcome the above described problems of the prior arts, and accordingly, it is an objective of the present invention to provide a method for fabricating a capacitor of a semiconductor device which stabilizes the operational characteristic of the electrodes of the capacitor, thereby improving the operational characteristic and the reliability of the semiconductor device.

It is another objective of the present invention to provide a method for fabricating a capacitor of a semiconductor device which is suitable for the high integration of the semiconductor device.

To achieve the above objectives, the present invention provides a method for fabricating a capacitor of a semiconductor device, the method comprising the steps of: preparing a semiconductor substrate; forming an insulating layer on the semiconductor substrate; forming a contact hole which exposes the semiconductor substrate, by selectively eliminating the lower insulating layer; forming a plug in the contact hole; forming a titanium/titanium nitride film on the plug and the lower insulating layer; forming a first ruthenium oxide film on the titanium/titanium nitride film; forming a first spin on glass film on the first ruthenium oxide film; implanting impurities into a surface of the first spin on glass film; forming a second spin on glass film on the first spin on glass film, and then selectively eliminating the first and the second spin on glass films; etching the first ruthenium oxide film and the titanium/titanium nitride film by utilizing the second and the first spin on glass films as a mask; eliminating the second and the first spin on glass films, and then forming a dielectric film on an exposed surface of the first ruthenium oxide film, the titanium/titanium nitride film, and the lower insulating layer, with the dielectric film having a specific dielectric constant; and forming a second ruthenium oxide film on the dielectric film.

Another aspect of the present invention provides a method for fabricating a capacitor of a semiconductor device, the method comprising the steps of: preparing a semiconductor substrate; forming an insulating layer on the semiconductor substrate; forming a contact hole which exposes the semiconductor substrate, by selectively eliminating the lower insulating layer; forming a plug in the contact hole; forming a first titanium nitride film on the plug and the lower insulating layer; forming a ruthenium oxide film on the first titanium nitride film; etching selectively the ruthenium oxide film and the first titanium nitride film; forming a dielectric film having a high specific dielectric constant, on an exposed surface of the ruthenium oxide film, the first titanium nitride film, and the lower insulating layer; forming a tungsten silicide film, a second titanium nitride film, and a polycrystalline silicon film on the dielectric film in serial order.

Another aspect of the present invention provides a method for fabricating a capacitor of a semiconductor device, the method comprising the steps of: preparing a semiconductor substrate; forming an insulating layer on the semiconductor substrate; forming a contact hole which exposes the semiconductor substrate, by selectively eliminating the lower insulating layer; forming a plug in the contact hole; forming a titanium/titanium nitride film and a first ruthenium oxide film on the plug and the lower insulating layer; eliminating selectively the first ruthenium oxide film and the titanium/titanium nitride film; forming a second ruthenium oxide film on the first ruthenium oxide film selectively eliminated; and forming a dielectric film having a high specific dielectric constant, on an exposed surface of the second ruthenium oxide film, the titanium/titanium nitride film, and the lower insulating layer, and then forming an upper electrode on the dielectric film.

BRIEF DESCRIPTION OF THE DRAWINGS

The present invention will be better understood and its various objects and advantages will be more fully appreciated from the following description taken in conjunction with the accompanying drawings in which.

DETAILED DESCRIPTION OF THE PREFERRED EMBODIMENTS

Hereinafter, several embodiments of the present invention will be described in detail with reference to the drawings.

FIGS. 2A to 2G are schematic cross sectional views of a semiconductor device which show the steps of a method for fabricating a capacitor of a semiconductor device according the first embodiment of the present invention.

Figure 2A:
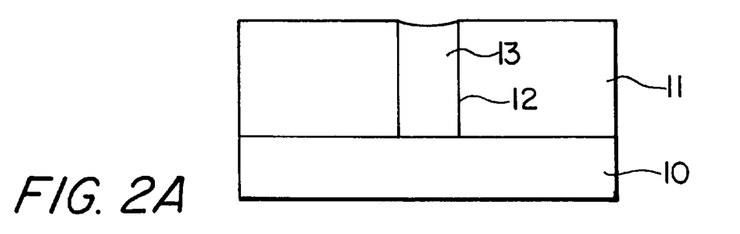
FIGS. 2A to 2G are schematic cross sectional views of a semiconductor device which show the steps of a method for fabricating a capacitor of a semiconductor device according the first embodiment of the present invention.

First, a semiconductor substrate 10 is prepared and a lower insulating layer 11 is formed on the semiconductor substrate 10 as shown in FIG. 2A. In this case, the lower insulating layer 11 is formed by depositing insulating material so as to make the surface of the layer even, after forming an element which isolates insulation film, a gate electrode, and bit line (all not shown).

Thereafter, the lower insulating layer 11 is selectively etched by means of a capacitor contact mask (not shown), so that a contact hole 12 for exposing that a predetermined portion of the semiconductor substrate 10 is formed.

Thereafter, a polycrystalline silicon film (not shown) is formed on the entire upper surface of the construction, and then the polycrystalline silicon film is etched so as to form a plug 13 of the polycrystalline silicon film in the contact hole 12.

Figure 2B:
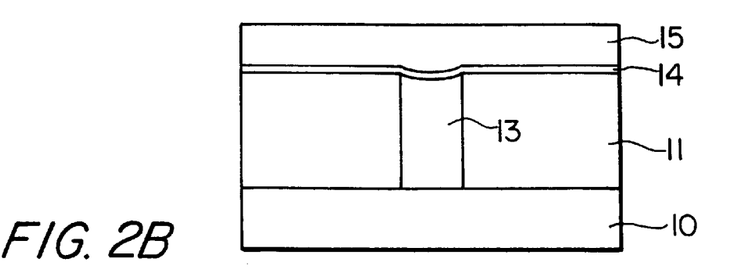

Then, as shown in FIG. 2B, a titanium/titanium nitride film (TiN) 14 and a first ruthenium oxide ($RuO_2$) film 15 are formed in serial order on the entire surface of the resultant construction.

In this case, the titanium/titanium nitride film 14 is deposited with a thickness between about 100 Å and about 1000 Å by utilizing chemical vapor deposition (CVD) or physical vapor deposition (PVD) in a selective manner.

Especially when the CVD method is used, the titanium/titanium nitride film 14 is formed by depositing $TiCl_4/NH_3$ gas under a temperature between about 500° C. and about 700° C., or is formed in a CVD reactor under a temperature between about 300° C. and about 500° C. by means of the thermal decompositing reaction of tetra-di-ethyl-amido-titanium (TDEAT) or tetra-di-methyl-amido-titanium (TDMAT) which is a metal organic compound.

Furthermore, the first $RuO_2$ film 15 is formed with a thickness between about 2000 Å and 5000 Å by means of ruthenium target and oxygen/argon gas in a sputtering reactor under a temperature between about 25° C. and 500° C. by direct current (DC) or radio frequency (RF) current.

Figure 2C:
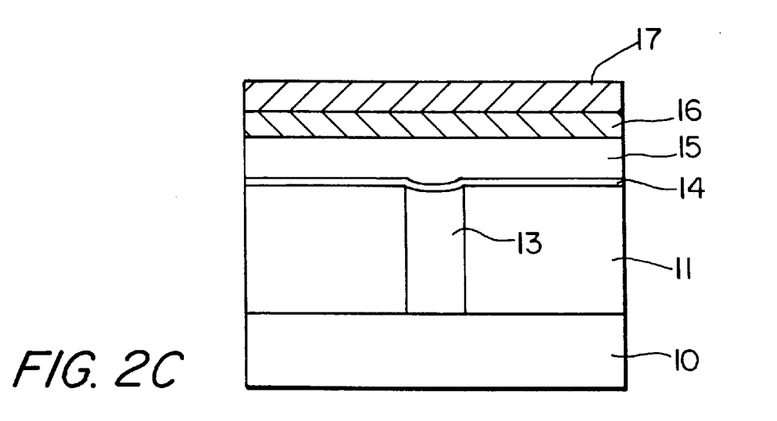

Thereafter, a first spin on glass (SOG) film 16 is formed with a predetermined thickness on the first $RuO_2$ film 15, as shown in FIG. 2C. Preferably, the thickness of the first SOG film 16 may be between about 500 Å and 1500 Å.

Then, the impurity ions are implanted into the first SOG film 16. It is preferred that platinum is used for the impurity ions.

Meanwhile, in implanting the impurity ions in the first SOG film 16, a gas of $Pt(CO)_2Cl_2$ is utilized with a concentration of $10^{19}$ ions/cm$^2$ and energy of more than 1 KeV, so that the impurity ions can be implanted through the first SOG film 16 into the surface area of the first $RuO_2$ film 15. The first SOG film 16 prevents the first $RuO_2$ film 15 from being damaged due to the above ion implanting process.

Thereafter, a second SOG film 17 is formed with a predetermined thickness on the first SOG film 16. It is preferred that the thickness of the second SOG film 17 may be between about 1000 Å and about 3500 Å.

Figure 2D:
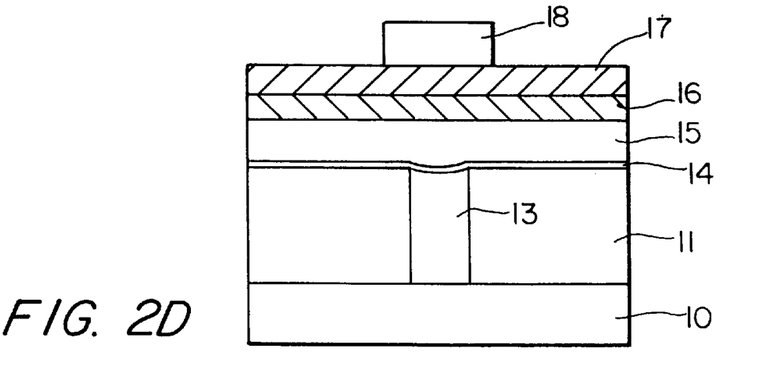

Thereafter, as shown in FIG. 2D, a photoresist film pattern 18 is formed on the second SOG film 17 through an etching process by means of a storage electrode mask (not shown).

Figure 2E:
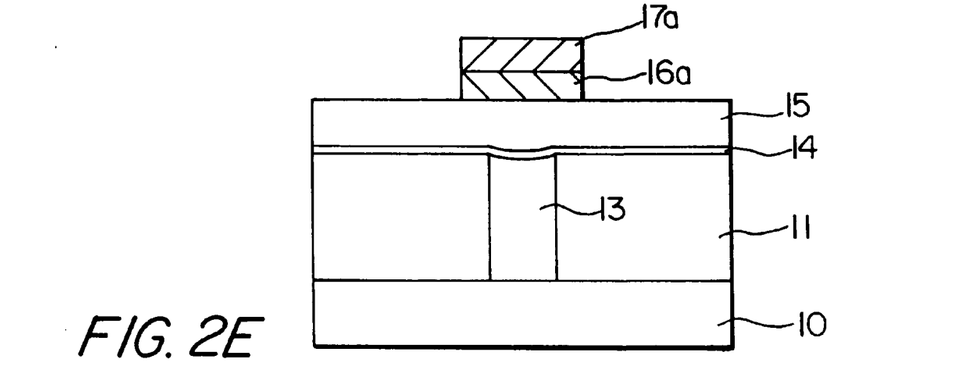

Thereafter, the second SOG film 17 and the first SOG film 16 are etched in serial order, as shown in FIG. 2E, by utilizing the photoresist film pattern 18 as a mask, and then the photoresist film pattern 18 is eliminated. In this case, the above etching is carried out by means of $CHF_3/CF_4$ solution in a reactive ion etching (RIE) reactor.

Figure 2F:
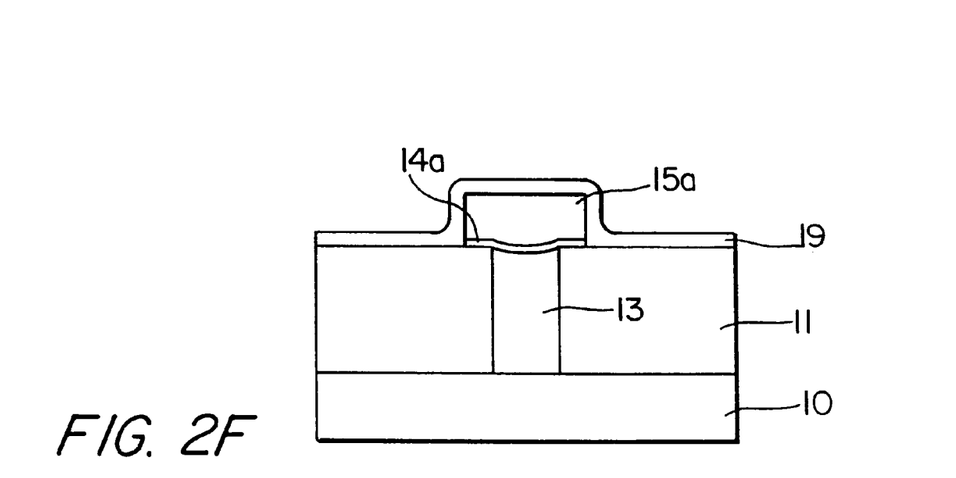

Then, the first $RuO_2$ film 15 and the titanium/titanium nitride film 14 are etched in serial order by utilizing the second and the first SOG film 17a and 16a, as a mask, which remains thereon after the etching, as shown in FIG. 2F. In this case, this etching is carried out by means of $Cl_2/O_2$, Ar gas in an RIE reactor.

Thereafter, a dielectric film 19 is formed on the entire upper exposed surface. In this case, the dielectric film 19 is formed with a thickness between about 300 Å and 700 Å by means of $Ba_{0.5}Sr_{0.5}TiO_3$ (BST) target under a temperature between about 25° C. and 700° C. by an electric power between about 50 W and 300 W. In addition, the dielectric film 19 is formed by using PVD or CVD method in a selective manner.

Particularly when the CVD method is used, the dielectric film 19 is deposited by using $Ti(T-OC_3H_7)_4$, $Sr(DPM)_2$, and $Ba(DPM)_2$ as raw gases. Also, the dielectric film 19 may be formed by utilizing lead zirconate titanate (PZT) as raw material.

Figure 2G:
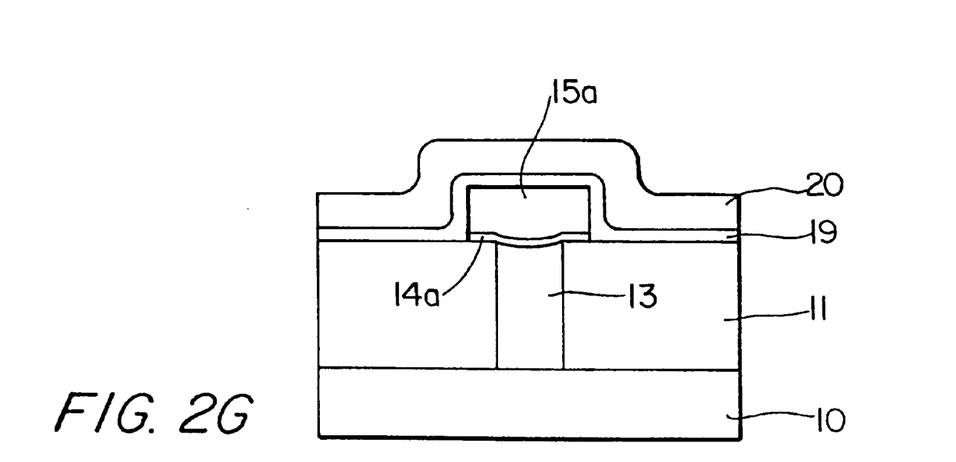

After the formation of the dielectric film 19, a second $RuO_2$ film 20 which is to serve as a plate electrode is formed on the dielectric film 19 as shown in FIG. 2G. In this case, the second $RuO_2$ film 20 is formed with a thickness between about 1000 Å and 3000 Å. Further, the formation of the second $RuO_2$ film 20 is carried out under a temperature between about 300° C. and 600° C. by means of $Ru(DPM)_3$ and $O_2$ gas or $Ru(DPM)_3$ and $O_3$ gas in a low pressure chemical vapor deposition (LPCVD) reactor.

A method for fabricating a capacitor of a semiconductor device according to the second embodiment of the present invention will be described in detail hereunder with reference to the drawings.

FIGS. 3A to 3E are schematic cross sectional views of a semiconductor device for showing the steps of the method for fabricating a capacitor of a semiconductor device according the second embodiment of the present invention.

Figure 3A:
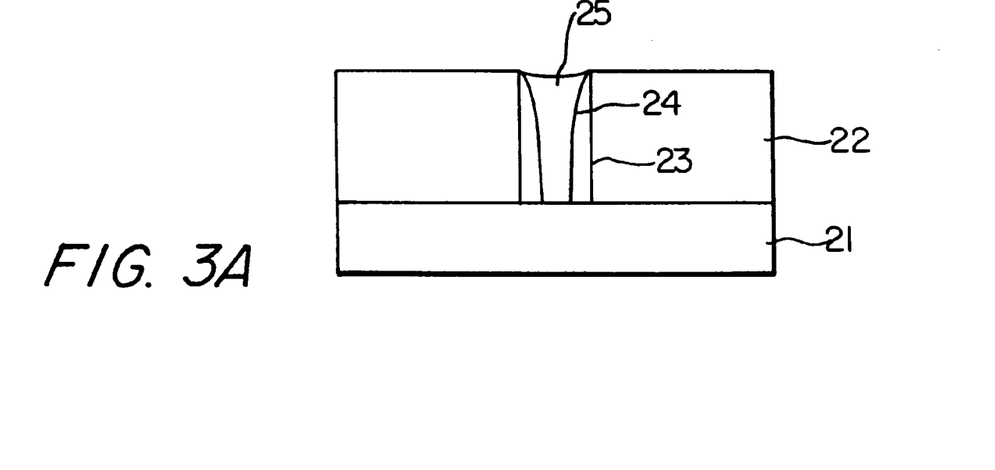
FIGS. 3A to 3E are schematic cross sectional views of a semiconductor device which show the steps of a method for fabricating a capacitor of a semiconductor device according the second embodiment of the present invention.

At first, a lower insulating layer 22 is formed on a semiconductor substrate 21 as shown in FIG. 3A. In this case, the lower insulating layer 22 is formed by depositing insulating material after forming an element isolating insulation film, a gate electrode, and bit line (all now shown).

Thereafter, the lower insulating layer 22 is selectively etched by means of a capacitor contact mask (not shown), so that a contact hole 23, which exposes a predetermined portion of the semiconductor substrate 21, is formed.

After the contact hole 23 is arranged, an oxide film spacer 24 is formed on the inner side wall of the contact hole 23.

Thereafter, a polycrystalline silicon film (not shown) is formed with a certain thickness throughout the entire upper surface of the construction, and then the polycrystalline silicon film is etched so as to form a plug 25 of the polycrystalline silicon film in the contact hole 23.

Figure 3B:
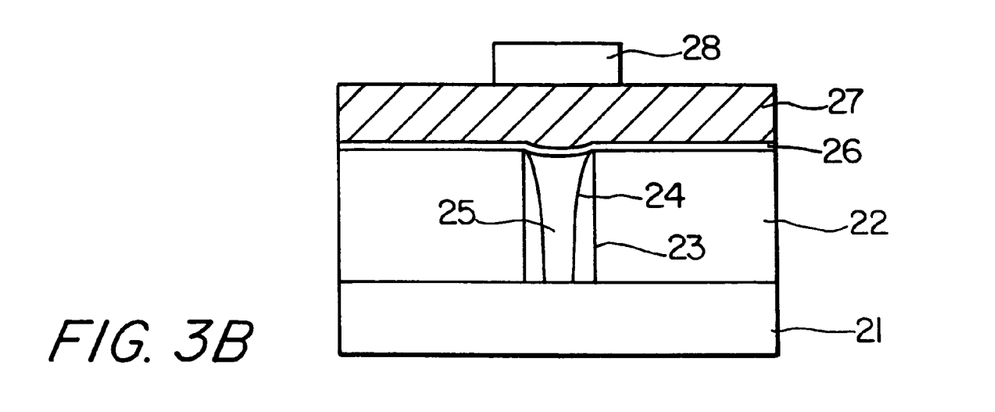

Then, as shown in FIG. 3B, a first titanium nitride film 26 and an $RuO_2$ film 27 are formed in serial order throughout the entire surface of the resultant construction.

In this case, the first titanium nitride film 26 is deposited with a thickness between about 100 Å and about 500 Å by utilizing chemical vapor deposition (CVD) or physical vapor deposition (PVD) in a selective manner.

Particularly when the CVD method is used, the titanium/titanium nitride film 14 is formed by depositing $TiCl_4/NH_3$ gas under a temperature between about 500° C. and 700° C., or is formed in a CVD reactor under a temperature between about 300° C. and 500° C. by means of the thermal decompositing reaction of tetra-di-ethyl-amido-titanium (TDEAT) or tetra-di-methyl-amido-titanium (TDMAT) which is a metal organic compound.

Furthermore, the $RuO_2$ film 27 is formed with a thickness between about 2000 Å and 5000 Å by means of ruthenium target and oxygen/argon gas under a temperature between about 25° C. and 500° C. by direct current (DC) or radio frequency (RF) current.

Thereafter, a photoresist film pattern 28 is formed on the ruthenium oxide film 27 through an etching process by means of a storage electrode mask (not shown).

Figure 3C:
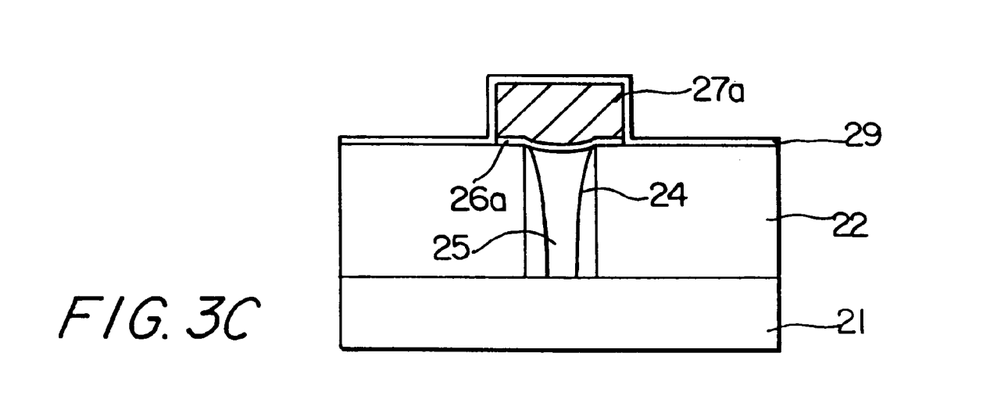

Thereafter, as shown in FIG. 3C, the $RuO_2$ film 27 and the first titanium nitride film 26 are etched in serial order by utilizing the photoresist film pattern 28 as a mask, and then the photoresist film pattern 28 is eliminated. In this case, the above etching of the $RuO_2$ film 27 and the first titanium nitride film 26 is carried out by means of $Cl_2O_2$ gas in RIE reactor.

Thereafter, a dielectric film 29, a BST film, is formed on the $RuO_2$ film 27a and the first titanium nitride film 26a remaining after the etching of the films 27 and 26 by depositing BST material with a predetermined thickness thereon. In this case, the BST film 29 is formed with a thickness between about 300 Å and 700 Å by means of $Ba_{0.5}Sr_{0.5}TiO_3$ (BST) target under a temperature between about 25° C. and about 700° C. with electric power between about 50 W and 300 W. In addition, the dielectric film 29 is formed by depositing dielectric material according to a CVD method.

In this case, the dielectric film 29 is deposited by using $Ti(T-OC_3H_7)_4$, $Sr(DPM)_2$, and $Ba(DPM)_2$ as the dielectric material. Also, the dielectric film 29 may be formed by means of PZT.

Figure 3D:
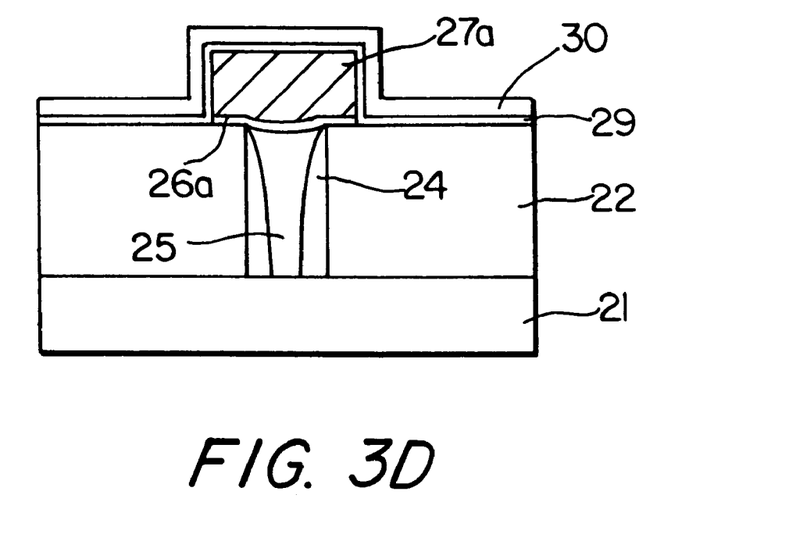

Thereafter, a tungsten silicide film 30 is formed with a predetermined thickness on the BST film 29. Preferably, the thickness may be between about 50 Å and 900 Å. Furthermore, the formation of the tungsten silicide film 30 is carried out under a temperature between about 300° C. and 700° C. by means of $WF_6$ and $SiH_2Cl_2$ gas or $WF_6$ and $SiH_4$ gas in an LPCVD reactor.

In this case, the tungsten silicide film 30 prevents the BST film 29 from being contaminated by silicide and at the same time, reduces the stress in the BST film 29 and the upper electrode due to the succeeding high-temperature process.

Figure 3E:
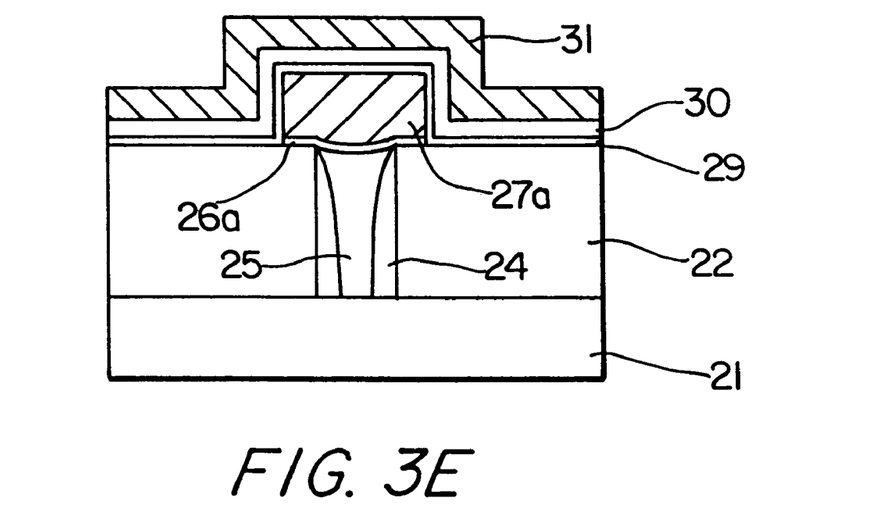

Thereafter, as shown in FIG. 3E, a second titanium nitride film and a polycrystalline silicon film are deposited in serial order on the tungsten silicide film 30 so as to form a second titanium nitride/polycrystalline silicon multi-film 31 thereon.

In this case, the second titanium nitride film is deposited by means of the thermal decompositing reaction of TDEAT, TDMAT, or $TiCl_4/NH_3$ under a temperature between about 200° C. and about 700° C. in a CVD reactor.

Moreover, the second titanium nitride film prevents diffusion of impurities between the upper electrode and the dielectric film, thereby maintaining the film characteristic of each film.

In addition, the polycrystalline silicon film is deposited with a thickness between about 1000 Å and 5000 Å by utilizing SiH$_4$ and SiH$_2$Cl$_2$ as reacting gas under a temperature between about 450° C. and 700° C. in an LPCVD reactor.

In this case, the laminated construction of the tungsten silicide film 30 and second titanium nitride/polycrystalline silicon multi-film 31 serves as the upper electrode of the capacitor.

Another method for fabricating a capacitor of a semiconductor device according to the third embodiment of the present invention will be described in detail hereunder with reference to the drawings.

FIGS. 4A to 4G are schematic cross sectional views of a semiconductor device which show the steps of the method for fabricating a capacitor of a semiconductor device according the third embodiment of the present invention.

Figure 4A:
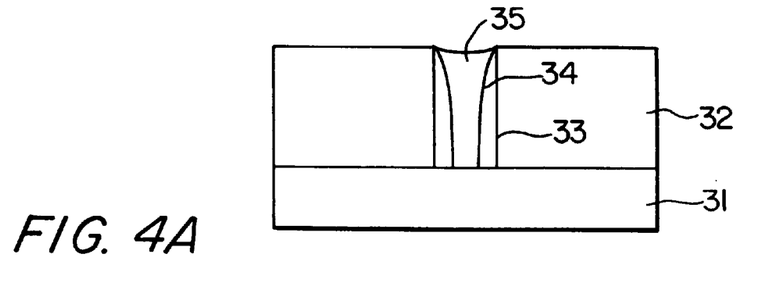
FIGS. 4A to 4G are schematic cross sectional views of a capacitor semiconductor which show the steps of a method for fabricating a capacitor of a semiconductor device according the third embodiment of the present invention.

At first, a lower insulating layer 32 is formed on a semiconductor substrate 31, as shown in FIG. 4A. In this case, the lower insulating layer 32 is formed by depositing insulating material after forming an element which isolates an insulation film, a gate electrode, and a bit line (all now shown).

Thereafter, the lower insulating layer 32 is selectively etched by means of a capacitor contact mask (not shown), so that a contact hole 33, which exposes a predetermined portion of the semiconductor substrate 31, is formed.

After the contact hole 33 is arranged, an oxide film spacer 34 is formed on the inner side wall of the contact hole 33.

Thereafter, a polycrystalline silicon film (not shown) is formed with a certain thickness throughout the entire upper surface of the construction, and then the polycrystalline silicon film is etched so as to form a plug 35 of the polycrystalline silicon film in the contact hole 33.

Figure 4B:
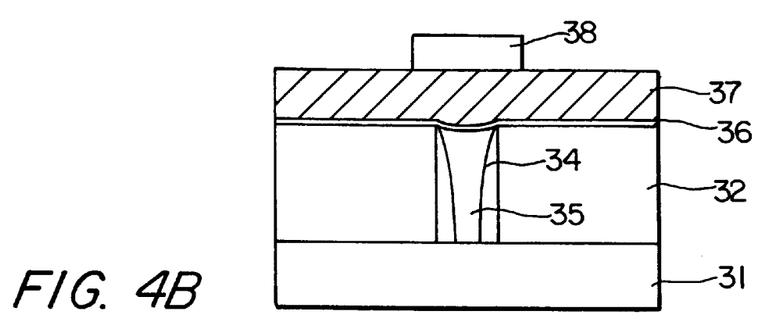

Then, as shown in FIG. 4B, a first titanium/titanium nitride film 36 and a first RuO$_2$ film 37 are formed in serial order throughout the entire surface of the resultant construction now.

In this case, the titanium film of the titanium/titanium nitride film 36 has a thickness between about 100 Å and 300 Å, and the titanium nitride film thereof has a thickness between about 200 Å and 500 Å.

Further, the first ruthenium oxide film 37 is formed with a thickness between about 3000 Å and 5000 Å. The first ruthenium oxide film 37 is deposited through sputtering, by means of ruthenium target, or by depositing Ru(C$_3$H$_5$)$_2$, Ru(NO)(NO$_3$)$_3$, RuO$_4$, RuF$_5$, H$_3$Ru(SO$_3$)$_2$OH, and the like, under a temperature between about 200° C. and 500° C. through a CVD method.

Thereafter, a photoresist film pattern 38 is formed on the first ruthenium oxide film 37 through an etching process by means of a storage electrode mask (not shown).

Figure 4C:
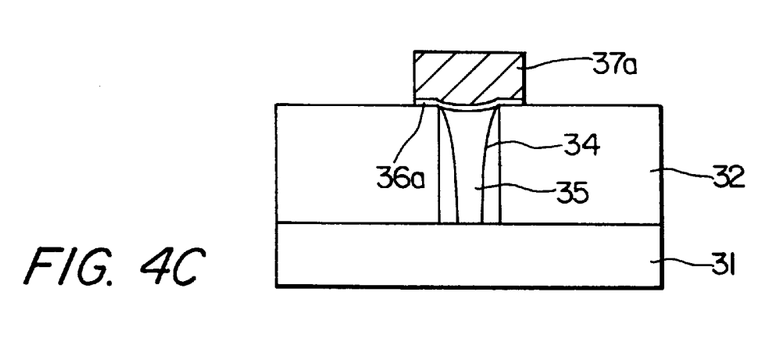

Thereafter, as shown in FIG. 4C, the first RuO$_2$ film 37 and the titanium/titanium nitride film 36 are etched in serial order by utilizing the photoresist film pattern 38 as a mask, and then the photoresist film pattern 38 is eliminated. In this case, the above etching of the first RuO$_2$ film 37 and the titanium/titanium nitride film 36 is carried out by utilizing the lower insulating layer 32 as an etching barrier.

Figure 4D:
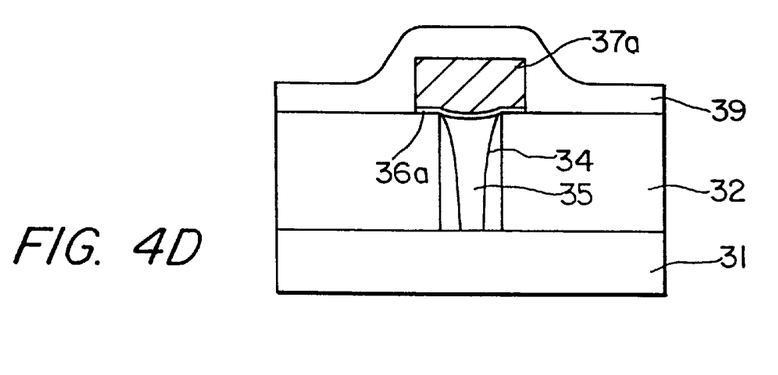

Thereafter, as shown in FIG. 4D, an SOG oxide film 39 is formed on the first RuO$_2$ film 37a, and the titanium/titanium nitride film 36a remains after the etching of the films 37 and 36. In this case, it is preferred that the SOG film 39 is formed with a thickness between about 1000 Å and 5000 Å.

Figure 4E:
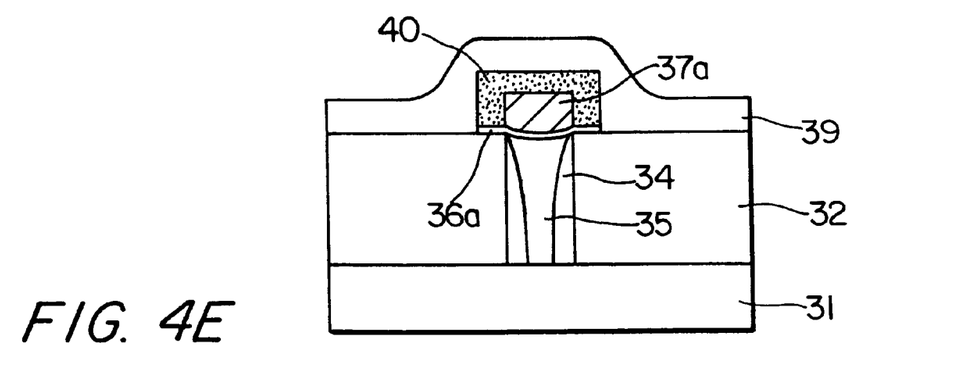

Thereafter, as shown in FIG. 4E, a second ruthenium oxide film 40 is formed by subjecting the entire construction to annealing treatment for about 30 minutes to 120 minutes in a tube (not shown) at a temperature between 400° C. and 800° C.

In this case, the second ruthenium oxide film 40 is formed with a thickness between about 300 Å and 500 Å on the first ruthenium oxide film 37 because of the oxidation process in which oxygen in the SOG oxide film 39 is diffused into the first ruthenium oxide film 37.

In the meantime, when the thickness of the second ruthenium oxide film 40 formed through the process shown by FIGS. 4D and 4E, is not sufficient, the SOG oxide film 39 may be formed to have a thickness of not more than 500 Å, and then may be subjected to an annealing treatment after implanting, thereunto, oxygen which serves as impurities, so that a proper and sufficient ruthenium oxide film may be formed.

Figure 4F:
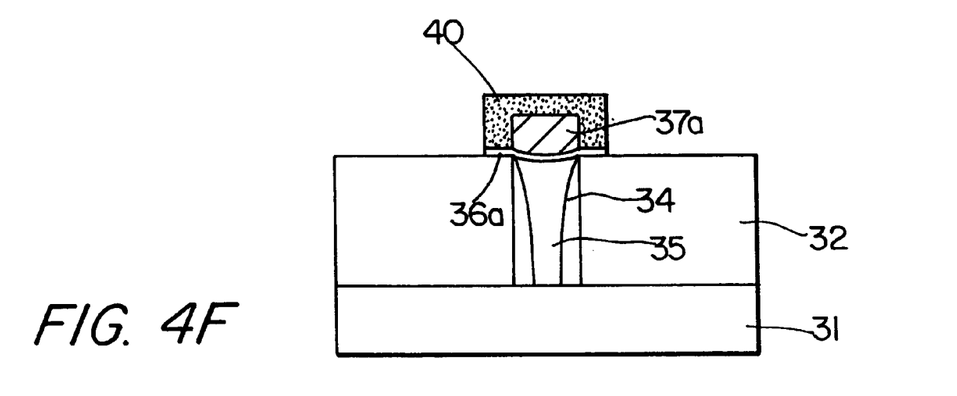

Thereafter, the SOG oxide film 39 is eliminated as shown in FIG. 4F. In this case, the elimination of the SOG oxide film 39 is carried out by putting the entire construction in a solution containing buffered oxide etchant (BOE) solution and pure water mixed in the ratio of 100:1 in a container.

Figure 4G:
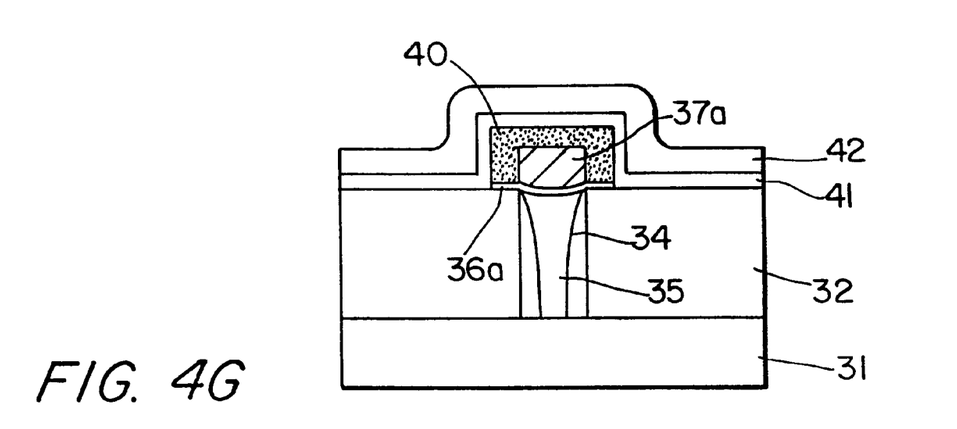

Thereafter, as shown in FIG. 4G, a dielectric film 41 and an upper electrode 42 is formed in serial order throughout the entire exposed upper surface of the resultant construction, In this case, the dielectric film 41 may be formed by using BST or PZT having high dielectric constant in a selective manner.

As described above, in the method for fabricating a capacitor of a semiconductor device according to the first embodiment of the present invention, when impurities are doped, the SOG film prevents damage to the RuO$_2$ film, which serves as a storage electrode and degradation thereof due to the succeeding high-temperature process, so that the leakage current characteristic of the RuO$_2$ film is improved.

Furthermore, in the method for fabricating a capacitor of a semiconductor device according to the second embodiment of the present invention, the upper electrode is formed by a laminated construction of tungsten silicide film/ titanium nitride film/poly crystalline film on a dielectric film, so that the film qualities of the dielectric film and the upper electrode are prevented from being degraded.

Moreover, in the method for fabricating a capacitor of a semiconductor device according to the third embodiment of the present invention, since a stable ruthenium oxide film is formed between the lower electrode and the dielectric film, the density of the leaking current in the semiconductor device is reduced and thereby, the operational characteristic of the semiconductor device is improved.

Therefore, the method of the present invention improves reliability of a semiconductor device and further enables the high integration of the semiconductor device.

The present invention has been described in an illustrative manner, and it is to be clearly understood that the terminology used is intended to be in the nature of description rather than limitation.

Many modifications and variations of the present invention are possible in light of the above teachings. Therefore, it is to be understood that within the scope of the appended claims, the invention may be used in ways other than those specifically described.

What is claimed is:

1. A method for fabricating a capacitor of a semiconductor device, the method comprising the steps of:

preparing a semiconductor substrate;

forming an insulating layer on said semiconductor substrate;

forming a contact hole which exposes said semiconductor substrate, by selectively eliminating said lower insulating layer;

forming a plug in said contact hole;

forming a first titanium nitride film on said plug and said lower insulating layer;

forming a ruthenium oxide film on said first titanium nitride film;

etching selectively said ruthenium oxide film and said first titanium nitride film;

forming a dielectric film having a high specific dielectric constant, on an exposed surface of said ruthenium oxide film, said first titanium nitride film, and said lower insulating layer;

forming a tungsten silicide film, a second titanium nitride film, and a polycrystalline silicon film on said dielectric film in serial order.

2. The method as claimed in claim 1, wherein said ruthenium oxide film is formed to have a thickness between 2000 Å and 5000 Å in a low pressure chemical vapor deposition reactor under a temperature between 25° C. and 500° C.

3. The method as claimed in claim 1, wherein said step of etching selectively said ruthenium oxide film and said first titanium nitride film is carried out by means of $Cl_2/O_2$ in a reactive ion etching reactor.

4. The method as claimed in claim 1, wherein said tungsten silicide film is formed in a low pressure chemical vapor deposition reactor under a temperature between 300° C. and 700° C.

5. The method as claimed in claim 1, wherein said dielectric film, having the high specific dielectric constant, is formed by means of $Ba_{0.5}Sr_{0.5}TiO_3$.

6. The method as claimed in claim 1, wherein said dielectric film, having a high specific dielectric constant, is formed by means of lead zirconate titanate.

* * * * *